(12) United States Patent
Tajimi

(10) Patent No.: US 7,514,296 B2
(45) Date of Patent: Apr. 7, 2009

(54) METHOD FOR MANUFACTURING SEMICONDUCTOR DEVICE

(75) Inventor: Shigehisa Tajimi, Shonai (JP)

(73) Assignee: Seiko Epson Corporation (JP)

( * ) Notice: Subject to any disclaimer, the term of this patent is extended or adjusted under 35 U.S.C. 154(b) by 204 days.

(21) Appl. No.: 11/682,498

(22) Filed: Mar. 6, 2007

(65) Prior Publication Data
US 2007/0212814 A1 Sep. 13, 2007

(30) Foreign Application Priority Data
Mar. 7, 2006 (JP) .............................. 2006-060770

(51) Int. Cl.
H01L 21/50 (2006.01)
H01L 21/48 (2006.01)
H01L 21/44 (2006.01)

(52) U.S. Cl. .................... 438/123; 438/111; 438/112; 438/106

(58) Field of Classification Search ................. 438/111, 438/112, 123, 106; 257/668
See application file for complete search history.

(56) References Cited

U.S. PATENT DOCUMENTS

| | | | | |
|---|---|---|---|---|
| 5,659,198 A | * | 8/1997 | Okutomo et al. | 257/659 |
| 5,744,859 A | * | 4/1998 | Ouchida | 257/668 |
| 6,380,620 B1 | * | 4/2002 | Suminoe et al. | 257/706 |
| 6,518,649 B1 | * | 2/2003 | Iwane et al. | 257/668 |
| 7,170,145 B2 | * | 1/2007 | Naitoh | 257/616 |
| 7,408,242 B2 | * | 8/2008 | Yamanaka et al. | 257/666 |
| 2002/0149027 A1 | * | 10/2002 | Takahashi et al. | 257/100 |
| 2004/0061240 A1 | * | 4/2004 | Seko | 257/782 |

FOREIGN PATENT DOCUMENTS

| | | |
|---|---|---|
| JP | 2001-085475 | 3/2001 |
| JP | 2006-086214 | 3/2006 |

* cited by examiner

*Primary Examiner*—Luan C Thai
(74) *Attorney, Agent, or Firm*—Harness, Dickey & Pierce, P.L.C.

(57) ABSTRACT

A method for manufacturing a semiconductor device includes preparing a wiring board including a base board having a first surface and a second surface, a wiring pattern having a plurality of electrical connectors and formed on the first surface, a first resist layer having a first opening for exposing the electrical connectors and partially covering the first surface and the wiring pattern, and a second resist layer having a second opening that overlaps with a region where the electrical connectors are formed and partially covering the second surface; preparing a semiconductor chip having a plurality of electrodes; and performing a bonding operation for electrically coupling the plurality of electrical connectors and the plurality of electrodes correspondingly by holding and heating the semiconductor chip with a bonding tool that has a heating mechanism and an end face whose contour is smaller than that of the second opening, aligning the bonding tool in such a way that the end face only overlaps with a region inside the second opening on the second surface, and mounting the semiconductor chip on the first surface of the wiring board.

7 Claims, 3 Drawing Sheets

METHOD FOR MANUFACTURING SEMICONDUCTOR DEVICE

The entire disclosure of Japanese Patent Application No. 2006-060770, filed Mar. 7, 2006 is expressly incorporated by reference herein.

BACKGROUND

1. Technical Field

The present invention relates to a method for manufacturing a semiconductor device.

2. Related Art

There is a known wiring board having a resist layer on each of opposite surfaces of a base board. As a step of mounting a semiconductor chip on a wiring board, there is a known step of heating a semiconductor chip with a bonding tool.

The resist layer may be softened under the influence of the heat radiated from the bonding tool. When the softened resist layer is pressed against a bonding stage in mounting a semiconductor chip on a wiring board, the resist layer may adhere to the bonding stage. The adhesion of the resist layer to the bonding stage may cause the separation of the resist layer and the contamination of the bonding stage.

JP-A-2001-85475 is an example of related art.

SUMMARY

An advantage of the invention is to provide a method for manufacturing a highly reliable semiconductor device.

1. According to a first aspect of the invention, a method for manufacturing a semiconductor device includes preparing a wiring board including a base board having a first surface and a second surface, a wiring pattern having electrical connectors and formed on the first surface, a first resist layer having a first opening for exposing the electrical connectors and covering at least a part of the first surface and a part of the wiring pattern, and a second resist layer having a second opening that overlaps with a region where the electrical connectors are formed and covering at least a part of the second surface; preparing a semiconductor chip having electrodes; and performing a bonding operation for electrically coupling the electrical connectors and the electrodes correspondingly by holding and heating the semiconductor chip with a bonding tool that has a heating mechanism and an end face whose contour is smaller than that of the second opening, aligning the bonding tool in such a way that the end face only overlaps with a region inside the second opening on the second surface, and mounting the semiconductor chip on the wiring board with the semiconductor chip facing the first surface.

According to the above method, the second resist layer has a second opening. Further, in mounting the semiconductor chip on the wiring board, the bonding tool is aligned in such a way that the end face is positioned within the second opening. In other words, the bonding tool is aligned in such as way that the end face does not overlap with the second resist layer.

Since the influence of the heat (radiant heat) from the bonding tool on the second resist layer in mounting the semiconductor chip on the wiring board can be reduced by this method, the second resist layer can be prevented from being excessively heated. Therefore, the adhesion of the second resist layer to the bonding stage in the bonding operation can be prevented, and the separation of the second resist layer can also be prevented. Consequently, a highly reliable semiconductor device can be manufactured by the above method.

2. In the above method for manufacturing a semiconductor device, the contour of the end face of the bonding tool may be smaller than that of the first opening, and the semiconductor chip may be mounted on the wiring board in the bonding operation by aligning the bonding tool in such a way that the end face only overlaps with a region inside the first opening on the first surface.

By the above method, the influence of the heat (radiant heat) from the bonding tool on the first resist layer in the bonding operation can be reduced. Therefore, the deterioration of the first resist layer can be prevented and, consequently, a highly reliable semiconductor device can be manufactured.

3. In the above method for manufacturing a semiconductor device, the contour of the end face of the bonding tool may be larger than that of the semiconductor chip.

4. In the above method for manufacturing a semiconductor device, the contour of the end face of the bonding tool may be smaller than that of the semiconductor chip, and the contour of the end face of the bonding tool may be larger than that of a region where the electrical connectors are formed.

5. In the above method for manufacturing a semiconductor device, the bonding operation may be performed by placing the wiring board on a bonding stage having a sucker and mounting the semiconductor chip on the wiring board while sucking a region exposed through the second opening on the second surface by the sucker.

6. According to a second aspect of the invention, a method for manufacturing a semiconductor device includes preparing a wiring board including a base board having a first surface and a second surface, a wiring pattern having electrical connectors and formed on the first surface, a first resist layer having a first opening for exposing the electrical connectors and partially covering the first surface and the wiring pattern, and a second resist layer having a second opening that overlaps with a region where the electrical connectors are formed and partially covering the second surface; preparing a semiconductor chip having electrodes; and performing a bonding operation for electrically coupling the electrical connectors and the electrodes correspondingly by placing the wiring board on a bonding stage having a sucker and mounting the semiconductor chip on the wiring board while sucking a region exposed through the second opening on the second surface by the sucker.

According to the second aspect of the invention, the second resist layer has a second opening. Further, the semiconductor chip is mounted on the wiring board in the bonding operation with a region exposed through the second opening on the second surface being sucked by the sucker. This means that the second surface of the base board is sucked avoiding the second resist layer in the bonding operation according to the second aspect of the invention. Therefore, the adhesion of the second resist layer to the bonding stage can be prevented, and the separation of the second resist layer can also be prevented. Consequently, a highly reliable semiconductor device can be manufactured by the above method.

7. In the above method for manufacturing a semiconductor device, the wiring board may have a second wiring pattern on the second surface, and the second resist layer may cover the second wiring pattern.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings. However, the invention is not limited thereto and includes any combination thereof.

First Embodiment

FIGS. 1 to 4 are diagrams for describing a method for manufacturing a semiconductor device according to a first embodiment of the invention.

Figure 1:
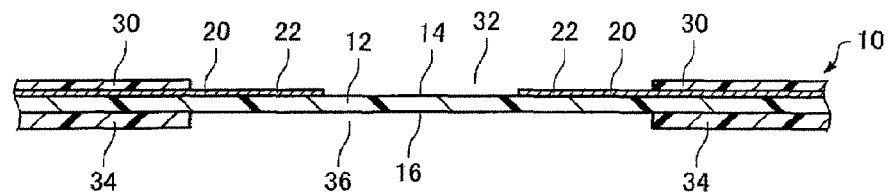
FIG. 1 is a diagram for describing a method for manufacturing a semiconductor device according to a first embodiment of the invention.

The method for manufacturing a semiconductor device according to the first embodiment includes preparing a wiring board 10 shown in FIG. 1. The configuration of the wiring board 10 will be described.

The wiring board 10 includes a base board 12, as shown in FIG. 1. The material and configuration of the base board 12 are not limited to specific ones and may be any publicly known board. The base board 12 may be either a flexible board or a rigid board. The base board 12 may also be a tape board. Further, the base board 12 may be either a multilayer board or a monolayer board. Furthermore, the base board 12 may be made of either an organic material or an inorganic material, or a combination thereof, for example. The base board 12 may also be a resin board. As the base board 12, a board or a film made of polyethylene terephthalate (PET), for example, may be used. A flexible board made of polyimide resin may also be used as the base board 12. As a flexible board, a tape used in a flexible printed circuit (FPC) or a tape-automated bonding (TAB) technique may be used. Examples of the base board 12 made of an inorganic material include a ceramic board and a glass board. Examples of a configuration made of a combination of organic and inorganic materials include a glass-epoxy board and the like.

The base board 12 has a first surface 14 and a second surface 16. The first and second surfaces 14 and 16 face opposite directions.

The wiring board 10 includes a wiring pattern 20 having a plurality of electrical connectors 22. The wiring pattern 20 (electrical connectors 22) is formed on the first surface 14 of the base board 12. The configuration of the wiring pattern 20 (electrical connectors 22) is not limited to a specific one. The wiring pattern 20 may be formed of either a single metal layer or a plurality of metal layers. For example, the wiring pattern 20 may have a configuration including layers of any of copper (Cu), chromium (Cr), titanium (Ti), nickel (Ni), and titanium-tungsten (Ti—W).

The wiring board 10 includes a first resist layer 30. The first resist layer 30 is formed on the first surface 14 of the base board 12 with the wiring pattern 20 therebetween. The first resist layer 30 has a first opening 32 for exposing the electrical connectors 22 of the wiring pattern 20. In other words, the first opening 32 is so formed as to expose the region where the electrical connectors 22 of the base board 12 are formed. It can also be said that the first resist layer 30 is so formed as to cover part of the wiring pattern 20. Further, the first resist layer 30 is so formed as to cover part of the first surface 14.

The wiring board 10 includes a second resist layer 34. The second resist layer 34 is so formed as to cover part of the second surface 16 of the base board 12. The second resist layer 34 has a second opening 36 for exposing the second surface 16. The second opening 36 is so formed as to overlap with the region where the electrical connectors 22 are formed. The second opening 36 may be so formed as to expose the entire region overlapping with a semiconductor chip 40 to be described later.

In addition, the wiring board 10 may also include a wiring pattern (not shown) formed on the second surface 16 of the base board 12. This means that the wiring board 10 may be a double-sided board. The wiring pattern may be so formed as to be partially exposed through the second opening 36. Alternatively, the wiring pattern may be so formed as to be entirely covered with the second resist layer 34.

Figure 2:
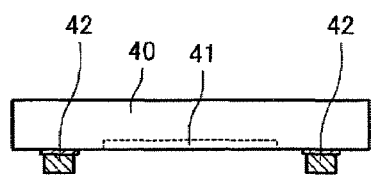
FIG. 2 is a diagram for describing the method for manufacturing a semiconductor device according to the first embodiment.

The method for manufacturing a semiconductor device according to the first embodiment may include preparing the semiconductor chip 40 shown in FIG. 2. The semiconductor chip 40 may have an integrated circuit 41. The configuration of the integrated circuit 41 is not limited to a specific one and may include an active element such as a transistor and a passive element such as a resistor, a coil, or a capacitor. The semiconductor chip 40 has a plurality of electrodes 42. The electrodes 42 may be electrically coupled to an inner part of the semiconductor chip 40. An electrode that is not electrically coupled to any inner part of the semiconductor chip 40 may be included in the electrodes 42. The electrodes 42 may include a pad and a bump formed on the pad, for example. The bump may be a gold bump. The bump may also be a nickel bump plated with gold. The semiconductor chip 40 may have a passivation layer, which is not shown. The passivation layer may be formed of, for example, $SiO_2$, SiN, polyimide resin, or the like.

The method for manufacturing a semiconductor device according to the first embodiment includes electrically coupling the electrical connectors 22 and the electrodes 42 correspondingly by mounting the semiconductor chip 40 on the wiring board 10. This step will be described.

Figure 3A:
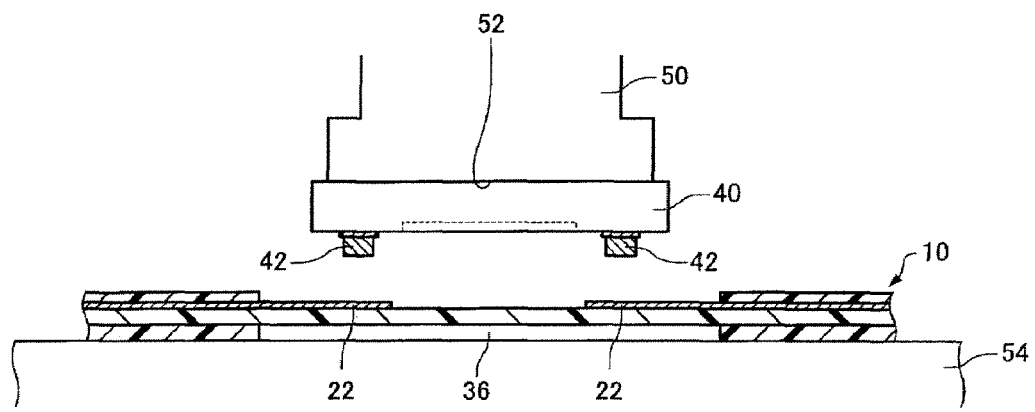
FIGS. 3A and 3B are diagrams for describing the method for manufacturing a semiconductor device according to the first embodiment.

In the above step, the semiconductor chip 40 is held by a bonding tool 50 (see FIG. 3A). The bonding tool 50 includes a heating mechanism. By holding the semiconductor chip 40 with the bonding tool 50, the semiconductor chip 40 can be heated. The bonding tool 50 may be a mechanism for holding the semiconductor chip 40 with an end face 52 having contact with the semiconductor chip 40. The contour of the end face 52 of the bonding tool 50 is smaller than that of the second opening 36. The contour of the end face 52 may be larger than that of the region where the electrodes 42 are formed. The bonding tool 50 holds the semiconductor chip 40 in such a way that the end face 52 overlaps with all the electrodes 42. The contour of the end face 52 of the bonding tool 50 may be smaller than that of the semiconductor chip 40 (see FIG. 3A). The first embodiment of the invention is not limited to the above cases, and a bonding tool (not shown) having an end face with a larger contour than that of the semiconductor chip 40 may also be used.

Figure 3B:
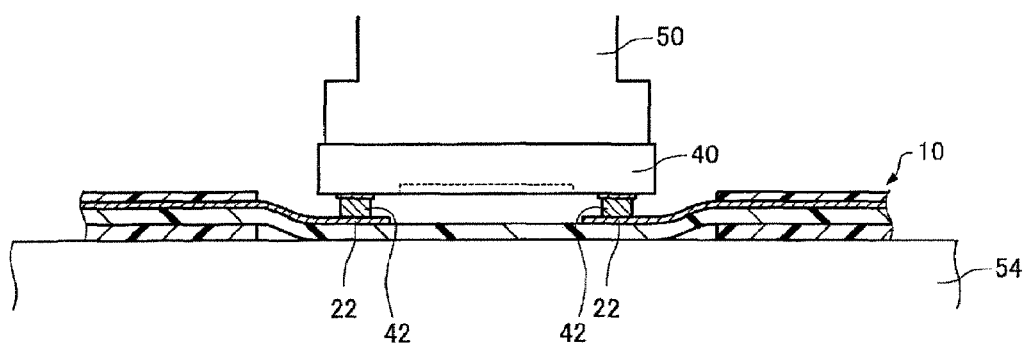

In the above step, the wiring board 10 is placed on a bonding stage 54 (see FIG. 3B). The wiring board 10 is placed in such a way that the second surface 16 of the base board 12 faces the bonding stage 54. In other words, the semiconductor chip 40 is mounted on the wiring board 10, in the above step, with the semiconductor chip 40 facing the first surface 14 of the base board 12.

In the above step, the wiring board 10 and the semiconductor chip 40 are aligned with each other in such a way that the electrical connectors 22 correspond to the electrodes 42. Here, the bonding tool 50 is aligned in such a way that the end face 52 only overlaps with the region inside the second opening 36. In other words, the bonding tool 50 is aligned with the wiring board 10 in such a way that the bonding tool 50 does not overlap with the second resist layer 34. This means that, in the method for manufacturing a semiconductor device according to the first embodiment, the second resist layer 34 (wiring board 10) is designed in such a way that the end face 52 of the bonding tool 50 is positioned within the second opening 36 by correspondingly positioning the electrical connectors 22 and the electrodes 42.

In the above step, the electrical connectors 22 and the electrodes 42 are electrically and correspondingly coupled to each other by mounting the semiconductor chip 40 on the wiring board 10, as shown in FIG. 3B. Here, the wiring board 10 and the semiconductor chip 40 are pressed against each other between the bonding tool 50 and the bonding stage 54. In other words, the electrical connectors 22 and the electrodes 42 are electrically coupled by pressing. The electrical connectors 22 and the electrodes 42 may be electrically coupled by giving contact with each other. Alternatively, the electrical connectors 22 and the electrodes 42 may be electrically coupled by providing conductive particles therebetween.

Figure 4:
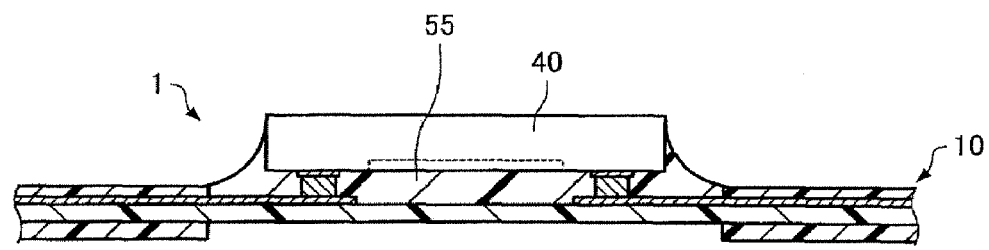
FIG. 4 is a diagram for describing the method for manufacturing a semiconductor device according to the first embodiment.

Through the above steps or the steps of forming a resin member 55 between the wiring board 10 and the semiconductor chip 40, cutting the wiring board 10, performing a test, and the like, a semiconductor device 1 shown in FIG. 4 can be manufactured. By the above method for manufacturing a semiconductor device, a highly reliable semiconductor device can be manufactured. Now, advantages of the method will be described.

While there is a known wiring board having a resist layer on each of opposite surfaces of a base board, the resist layer may be softened under the influence of the heat radiated from the bonding tool 50. When the softened resist layer is pressed against the bonding stage 54 in mounting a semiconductor chip on the wiring board, the resist layer may adhere to the bonding stage 54. The adhesion of the resist layer to the bonding stage 54 may cause the separation of the resist layer and the contamination of the bonding stage 54.

In the method for manufacturing a semiconductor device according to the first embodiment, the second resist layer 34 has the second opening 36. Further, in mounting the semiconductor chip 40 on the wiring board 10, the bonding tool 50 is aligned in such a way that the end face 52 is positioned within the second opening 36. In other words, the bonding tool 50 is aligned in such a way that the end face 52 does not overlap with the second resist layer 34. By this method, the influence of the heat (radiant heat) from the bonding tool 50 on the second resist layer 34 in mounting the semiconductor chip 40 on the wiring board 10 can be reduced. Therefore, the adhesion of the second resist layer 34 to the bonding stage 54 can be prevented, and the semiconductor chip 40 can be mounted without causing the separation of the second resist layer 34. Consequently, a highly reliable semiconductor device can be manufactured by the above method.

In addition, the contour of the end face 52 of the bonding tool 50 may be smaller than that of the first opening 32 of the first resist layer 30. Furthermore, in mounting the semiconductor chip 40 on the wiring board 10, the bonding tool 50 may be aligned in such a way that the end face 52 only overlaps with the region inside the first opening 32 of the first resist layer 30. In other words, the bonding tool 50 may be aligned in such a way that the end face 52 does not overlap with the first resist layer 30. By this method, the influence of the heat from the bonding tool 50 on the first resist layer 30 can be reduced. Therefore, the deterioration of the first resist layer 30 in mounting the semiconductor chip 40 on the wiring board 10 can be prevented. Consequently, a greatly reliable semiconductor device can be manufactured.

Second Embodiment

A method for manufacturing a semiconductor device according to a second embodiment of the invention will now be described. FIGS. 5A to 7 are diagrams for describing the method for manufacturing a semiconductor device according to the second embodiment.

Figure 5A:
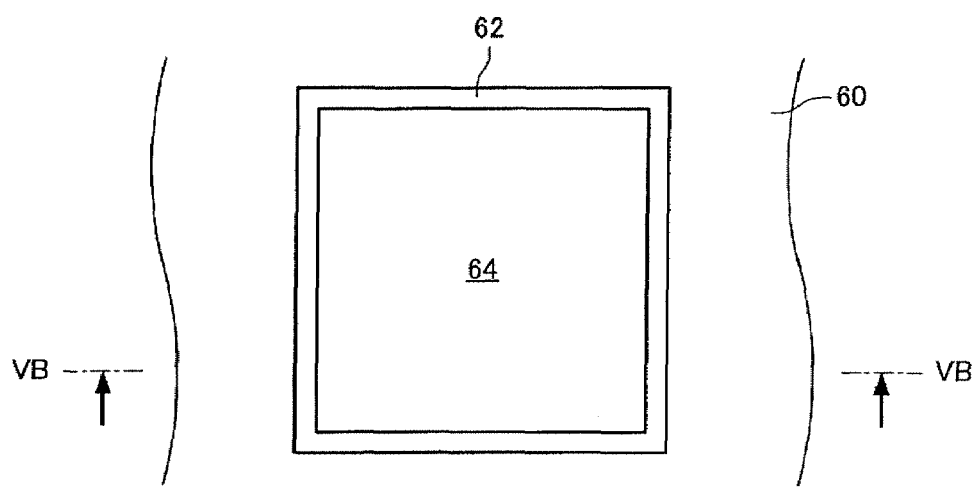
FIGS. 5A and 5B are diagrams for describing a method for manufacturing a semiconductor device according to a second embodiment of the invention.
Figure 5B:
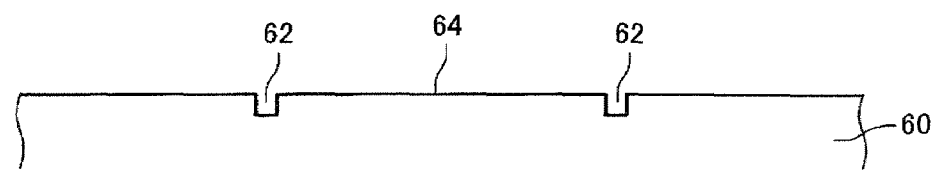

In the method for manufacturing a semiconductor device according to the second embodiment, the wiring board 10 is placed on a bonding stage 60 in mounting the semiconductor chip 40 on the wiring board 10. FIGS. 5A and 5B are diagrams for describing the bonding stage 60. FIG. 5A is a plan view of the bonding stage 60. FIG. 5B is a sectional view taken along the line VB-VB of FIG. 5A.

The bonding stage 60 has a sucker 62. The sucker 62 may be a recess like a groove. The sucker 62 is a part for sucking and securing a workpiece (the wiring board 10). The bonding stage 60 may also have a support 64. The support 64 is a region for supporting the wiring board 10 during bonding. The sucker 62 of the bonding stage 60 may be so provided as to surround the support 64. The suction method of the bonding stage 60 (sucker 62) is not limited to a specific one and may be vacuum suction, for example.

Figure 6:
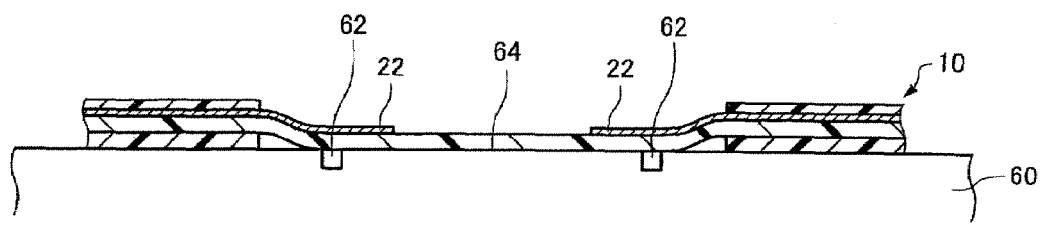
FIG. 6 is a diagram for describing the method for manufacturing a semiconductor device according to the second embodiment.

Further, in the method for manufacturing a semiconductor device according to the second embodiment, the wiring board 10 is placed on the bonding stage 60 and the part exposed through the second opening 36 on the second surface 16 of the base board 12 is sucked by the sucker 62, as shown in FIG. 6. The wiring board 10 may be aligned with the bonding stage 60 in such a way that the entire part of the region where the electrical connectors 22 are formed is supported.

Figure 7:
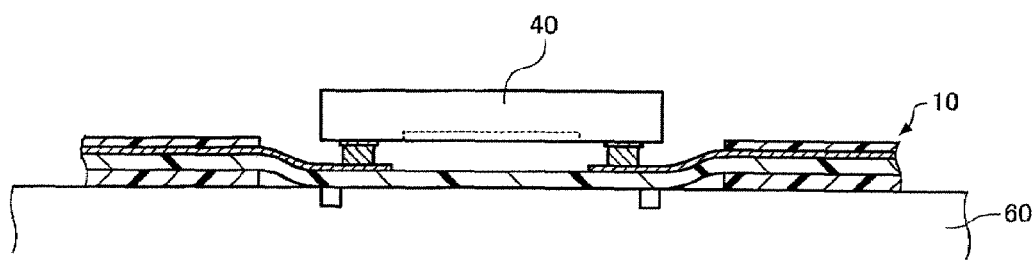
FIG. 7 is a diagram for describing the method for manufacturing a semiconductor device according to the second embodiment.

Furthermore, in the method for manufacturing a semiconductor device according to the second embodiment, the semiconductor chip 40 is mounted on the wiring board 10 with the part exposed through the second opening 36 on the second surface 16 of the base board 12 being sucked by the sucker 62, as shown in FIG. 7. A semiconductor device may be manufactured through the above steps.

In the method for manufacturing a semiconductor device according to the second embodiment, not the second resist layer 34 but the base board 12 (second surface 16) is sucked by the sucker 62. Therefore, the adhesion of the second resist layer 34 to the bonding stage 60 (in particular, around the sucker 62) in mounting the semiconductor chip 40 on the wiring board 10 can be prevented. Consequently, a semiconductor device can be manufactured without causing the separation of the second resist layer 34. Further, since the displacement of the wiring board 10 can be prevented by using the sucker 62, a highly reliable semiconductor device can be manufactured.

In addition, the contour of the bonding stage 60 may be larger than that of the second opening 36, as shown in FIG. 6. However, the invention is not limited thereto and a bonding stage having a contour smaller than that of the second opening 36 may also be used. In such a case too, a highly reliable semiconductor device can be manufactured.

While the invention is not limited to the embodiments described above, various modifications can be made thereto. For example, the invention includes a configuration that is substantially the same as those described in the embodiments (one based on the same function, method, and effect, or one based on the same object and advantage). The invention also includes a configuration where an unessential part of the configuration described in the embodiments is changed. Further, the invention includes a configuration where the same operational advantage as those described in the embodiments can be derived or a configuration where the same object as those described in the embodiments can be accomplished. Furthermore, the invention includes a configuration where a publicly known technique is added to those described in the embodiments.

What is claimed is:

1. A method for manufacturing a semiconductor device, comprising:

preparing a wiring board including a base board having a first surface and a second surface, a wiring pattern having electrical connectors and formed on the first surface, a first resist layer having a first opening for exposing the electrical connectors and covering at least a part of the first surface and a part of the wiring pattern, and a second resist layer having a second opening that overlaps with a region where the electrical connectors are formed and covering at least a part of the second surface;

preparing a semiconductor chip having electrodes; and performing a bonding operation for electrically coupling the electrical connectors and the electrodes correspondingly by holding and heating the semiconductor chip with a bonding tool that has a heating mechanism and an end face whose contour is smaller than that of the second opening, aligning the bonding tool in such a way that the end face only overlaps with a region inside the second opening on the second surface, and mounting the semiconductor chip on the wiring board with the semiconductor chip facing the first surface.

2. The method for manufacturing a semiconductor device according to claim 1, wherein the contour of the end face of the bonding tool is smaller than that of the first opening, and the semiconductor chip is mounted on the wiring board in the bonding operation by aligning the bonding tool in such a way that the end face only overlaps with a region inside the first opening on the first surface.

3. The method for manufacturing a semiconductor device according to claim 1, wherein the contour of the end face of the bonding tool is larger than that of the semiconductor chip.

4. The method for manufacturing a semiconductor device according to claim 1, wherein the contour of the end face of the bonding tool is smaller than that of the semiconductor chip, and the contour of the end face of the bonding tool is larger than that of a region where the electrical connectors are formed.

5. The method for manufacturing a semiconductor device according to claim 1, wherein the bonding operation is performed by placing the wiring board on a bonding stage having a sucker and mounting the semiconductor chip on the wiring board while sucking a region exposed through the second opening on the second surface by the sucker.

6. A method for manufacturing a semiconductor device, comprising:

preparing a wiring board including a base board having a first surface and a second surface, a wiring pattern having electrical connectors and formed on the first surface, a first resist layer having a first opening for exposing the electrical connectors and partially covering the first surface and the wiring pattern, and a second resist layer having a second opening that overlaps with a region where the electrical connectors are formed and partially covering the second surface;

preparing a semiconductor chip having electrodes; and performing a bonding operation for electrically coupling the electrical connectors and the electrodes correspondingly by placing the wiring board on a bonding stage having a sucker and mounting the semiconductor chip on the wiring board while sucking a region exposed through the second opening on the second surface by the sucker.

7. The method for manufacturing a semiconductor device according to claim 1, wherein the wiring board has a second wiring pattern on the second surface, and the second resist layer covers the second wiring pattern.

* * * * *